United States Patent
Spence Bickford et al.

(10) Patent No.: US 9,117,045 B2
(45) Date of Patent: Aug. 25, 2015

(54) SYSTEM AND METHOD TO PREDICT CHIP IDDQ AND CONTROL LEAKAGE COMPONENTS

(75) Inventors: Jeanne P. Spence Bickford, Essex Junction, VT (US); Nazmul Habib, South Burlington, VT (US); Robert McMahon, Essex Junction, VT (US)

(73) Assignee: INTERNATIONAL BUSINESS MACHINES COPORATION, Armonk, NY (US)

( * ) Notice: Subject to any disclaimer, the term of this patent is extended or adjusted under 35 U.S.C. 154(b) by 2184 days.

(21) Appl. No.: 12/031,079

(22) Filed: Feb. 14, 2008

(65) Prior Publication Data
US 2009/0210201 A1    Aug. 20, 2009

(51) Int. Cl.
G06F 17/50   (2006.01)
G01R 31/30   (2006.01)
H01L 21/66   (2006.01)

(52) U.S. Cl.
CPC .......... G06F 17/505 (2013.01); G01R 31/3008 (2013.01); G06F 17/5068 (2013.01); H01L 22/34 (2013.01)

(58) Field of Classification Search
CPC .................................................. G01R 31/3008
USPC ....................................... 703/14; 324/762.09
See application file for complete search history.

(56) References Cited

U.S. PATENT DOCUMENTS

| | | | | |
|---|---|---|---|---|
| 5,371,457 A | * | 12/1994 | Lipp | 324/158.1 |
| 5,638,006 A | * | 6/1997 | Nariani et al. | 324/765 |
| 5,652,524 A | * | 7/1997 | Jennion et al. | 324/765 |
| 5,721,495 A | * | 2/1998 | Jennion et al. | 324/765 |
| 5,742,177 A | * | 4/1998 | Kalb, Jr. | 324/765 |
| 5,757,203 A | | 5/1998 | Brown | |
| 5,808,476 A | | 9/1998 | Lee et al. | |
| 5,889,409 A | | 3/1999 | Kalb, Jr. | |
| 6,043,672 A | * | 3/2000 | Sugasawara | 324/765 |
| 6,140,832 A | * | 10/2000 | Vu et al. | 324/765 |
| 6,185,706 B1 | * | 2/2001 | Sugasawara | 714/724 |
| 6,239,607 B1 | * | 5/2001 | Maxwell et al. | 324/765 |
| 6,239,609 B1 | * | 5/2001 | Sugasawara et al. | 324/769 |
| 6,342,790 B1 | * | 1/2002 | Ferguson et al. | 324/765 |
| 6,714,032 B1 | * | 3/2004 | Reynick | 324/765 |
| 6,864,702 B1 | * | 3/2005 | Teggatz et al. | 324/762.09 |

(Continued)

OTHER PUBLICATIONS

"Leakage power analysis and reduction: models, estimation and tools", by A. Agarwal, S. Mukhopadhyay, C.H. Kim, A. Raychowdhury and K. Roy;IEE Proc.—Comput. Digit. Tech., vol. 152, No. 3, May 2005, p. 353-368.*

(Continued)

Primary Examiner — Akash Saxena
(74) Attorney, Agent, or Firm — David Cain; Roberts, Mlotkowski, Safran & Cole, P.C.

(57) ABSTRACT

A method for predicting and controlling leakage wherein an IDDQ prediction macro is placed in a plurality of design topographies and data is collected using the IDDQ prediction macro. The IDDQ prediction macro is configured to measure subthreshold leakage and gate leakage for at least one device type in a semiconductor test site and in scribe lines using the IDDQ prediction macro and establish a leakage model. The method correlates the semiconductor test site measurements and the scribe line measurements to establish scribe line control limits, predicts product leakage; and sets subthreshold leakage limits and gate leakage limits for each product using the leakage model.

26 Claims, 5 Drawing Sheets

(56) References Cited

U.S. PATENT DOCUMENTS

| | | | |
|---|---|---|---|
| 6,934,671 B2* | 8/2005 | Bertsch et al. | 703/14 |
| 7,064,565 B1* | 6/2006 | Xu et al. | 324/750 |
| 7,100,144 B2* | 8/2006 | Jacobson et al. | 716/18 |
| 7,149,674 B1* | 12/2006 | Sirichotiyakul et al. | 703/15 |
| 7,239,163 B1* | 7/2007 | Ralston-Good et al. | 324/750.3 |
| 7,487,487 B1* | 2/2009 | Polson et al. | 716/6 |
| 7,594,149 B2* | 9/2009 | Pilling | 714/726 |
| 8,626,480 B2* | 1/2014 | Chang et al. | 703/13 |
| 2003/0234655 A1* | 12/2003 | Sarma et al. | 324/663 |
| 2004/0160239 A1* | 8/2004 | Reynick | 324/765 |
| 2004/0214356 A1* | 10/2004 | Huang et al. | 438/14 |
| 2005/0044515 A1* | 2/2005 | Acar et al. | 716/5 |
| 2005/0062491 A1* | 3/2005 | Burns et al. | 324/763 |
| 2005/0090996 A1* | 4/2005 | Gattiker | 702/64 |
| 2005/0125761 A1* | 6/2005 | Jacobson et al. | 716/18 |
| 2005/0149887 A1* | 7/2005 | Chatterjee et al. | 716/2 |
| 2006/0190785 A1* | 8/2006 | Pilling | 714/726 |
| 2006/0241802 A1* | 10/2006 | Chen et al. | 700/121 |
| 2007/0001682 A1* | 1/2007 | Habitz et al. | 324/500 |
| 2008/0231307 A1* | 9/2008 | Bickford et al. | 324/765 |
| 2008/0315196 A1* | 12/2008 | Aghababazadeh et al. | 257/48 |
| 2010/0123483 A1* | 5/2010 | Chung et al. | 327/63 |

OTHER PUBLICATIONS

A Statistical Framework for Estimation of Full-Chip Leakage-Power Distribution Under Parameter Variations; by Hamed F. Dadgour et al; IEEE Transactions on Electron Devices, vol. 54, No. 11, Nov. 2007; pp. 2930-2945.*

* cited by examiner

SYSTEM AND METHOD TO PREDICT CHIP IDDQ AND CONTROL LEAKAGE COMPONENTS

FIELD OF THE INVENTION

The invention generally relates to a system and method for predicting and controlling leakage and, more particularly, to a system and method for controlling leakage using an integrated circuit quiescent current (IDDQ) Prediction Macro.

BACKGROUND OF THE INVENTION

Semiconductor technologies have continued to use smaller geometries to allow more circuitry on each integrated circuit product. As the geometries used to produce integrated circuit chips become smaller, the size of the silicon die becomes smaller, the products become faster and their unit cost decreases. Additionally, operating voltages decrease resulting in less overall power and leakage becomes a large proportion of total product power.

In technologies with larger geometries, leakage comprised such a small part of the total power that many products used leakage screens solely as a defect screen. Leakage monitoring in manufacturing lines assessed only the subthreshold component of leakage. In newer technologies, products are screened to limits that match the leakage models provided to customers with corresponding yield loss. While subthreshold leakage is still the predominate cause of leakages, other mechanisms such as gate leakage significantly contribute to overall product leakage and overall product power. Since the contribution of subtheshold leakage and gate leakage vary as a function of the device types used to build circuits in semiconductor products, it is important to identify the source of the leakage so that it can be controlled in the manufacturing process.

Current methods used to predict chip leakage have addressed the problem of leakage by calculating a chip's total leakage. This has traditionally been done by determining the number of times a device type occurs and multiplying that number by the estimated leakage for that type of device. This leakage estimation is determined under test conditions and is correlated to a few scribe line measurements using a one time set of manufacturing hardware. Using this calculation, the leakage of a single chip can be determined, however, a determination of how that single chip's leakage relates to other chips that are to be built using the library elements, or how the leakage will vary as the source of the leakage changes from subthreshold leakage to gate leakage, is unknown.

One of the problems with the current methods of predicting chip leakage is that there is no way to identify the source of the leakage, e.g., if it is subthreshold leakage or gate leakage. This is particularly important because subthreshold leakage and gate leakage behave differently as temperature changes. Furthermore, the temperature in which scribe line measurements are currently taken may be different than the actual temperature of the product while in use. Therefore, current methods do not evaluate how temperature impacts the amount of leakage that occurs within a chip. For example, a chip may be tested at temperatures ranging from 55-80° F. and have a total leakage of 35% of total power. However, in practice, that same chip may be used at temperatures upwards of 100-125° F., which may result in a total leakage of 65% of total power. Accordingly, the current methods of predicting chip leakage do not account for this type of variation.

Additional problems also exist with current methods for predicting chip leakage. For example, current methods do not consider chip variations that may occur as a result of shifting during the manufacturing process. These shifts may result in chips being offset such that the physical placement and distances between scribe lines on the chips vary from the tested chips. These inherent scribe-to-chip offsets may alter the topography of the chip and affect the type and amount of leakage that will be encountered by the chip as compared to the scribe line structures.

Accordingly, there exists a need in the art to overcome the deficiencies and limitations described hereinabove.

SUMMARY OF THE INVENTION

In a first aspect of the invention, a method for creating a leakage model comprises placing an integrated circuit quiescent current (IDDQ) prediction macro in a plurality of design topographies, collecting data using the IDDQ prediction macro, measuring subthreshold leakage and gate leakage for at least one device type in a semiconductor test site and the same device type in the scribe lines and establishing a leakage model. The method further comprises correlating the semiconductor test site measurements and the scribe line measurements to establish scribe line control limits, predicting product leakage, and setting subthreshold leakage limits and gate leakage limits for each product using the leakage model.

In another aspect of the invention, a method for analyzing product yields comprises setting subthreshold leakage limits and gate leakage limits for a product using a leakage model; screening the product to obtain subthreshold leakage and gate leakage yield losses; determining whether one or more of the subthreshold leakage and the gate leakage exceed the subthreshold leakage limits and gate leakage limits; and identifying corrective action to the semiconductor manufacturing line if one or more of the subthreshold leakage limits and/or the gate leakage limits are exceeded.

In yet another aspect of the invention, a computer program product measures subthreshold leakage and gate leakage using an IDDQ prediction macro; creates a leakage model using the measurements collected from the IDDQ prediction macro; correlates a product's scribe line measurements to the measurements collected from the IDDQ prediction macro; tracks yield losses for the subthreshold leakage and the gate leakage of the product; and determines whether the subthreshold leakage or the gate leakage of the product has been exceeded based on the model.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF EMBODIMENTS OF THE INVENTION

The invention is related to a system and method for predicting leakage and controlling leakage using IDDQ prediction macros. More specifically, the invention provides reliable device level leakage predictions for use in chip power estimates by way of an IDDQ prediction macro. The invention also provides a way for a die or module test to determine the cause of leakage related yield loss with the aid of a leakage model and provide feedback to manufacturers, designers, etc. Based on the amount and type of leakage in a design, the invention further provides a diagnostic tool configured to identify causes of leakage related yield loss and relay them to, e.g., product and engineering teams.

Leakage can be predicted using an IDDQ prediction macro, which is configured to include a statistically significant number of devices that are proportionate to the types and number of devices present in a product design. Within each IDDQ prediction macro there are one or more circuit set-ups that are structured and arranged to measure current and obtain an estimated leakage. The estimated leakage obtained by the IDDQ prediction macro can then be used to provide reliable device level leakage predictions for use in chip power estimates.

The invention includes a leakage model, which models leakage by placing IDDQ Prediction macros in a variety of chip topographies having different densities and/or isolated shapes. This allows more accurate modeling over different topographies in order to better predict device performance. IDDQ Prediction macros are configured to collect data and measure subthreshold leakage, gate leakage, and overall leakage, i.e., the sum of both types of leakage. Based on the data, the leakage model establishes scribe line control limits for a product by correlating a product design to scribe line measurements within the leakage model. After a correlation is made, the leakage model can be used to set individual test limits for leakage levels within a product design.

The test limits established via the leakage model can be used when testing a product in the design stage in order to determine whether the design should be mass produced, i.e., validated. Feedback on the testing, including diagnostics on the amount of overall yield loss, subthreshold yield loss, and gate oxide leakage yield loss, may be tracked and relayed to manufacturers and designers for use in analysis. Based on these diagnostics, test limits can be adjusted and/or problems within the product design may be pinpointed and fixed in subsequent designs. Alternatively, if the diagnostics are unfavorable then manufacturers may opt to discard a product design. Accordingly, the invention provides for an accurate and efficient model for identifying leakage yield losses and identifying gate leakage and subthreshold leakage across a product design.

SYSTEM ENVIRONMENT

Figure 1:
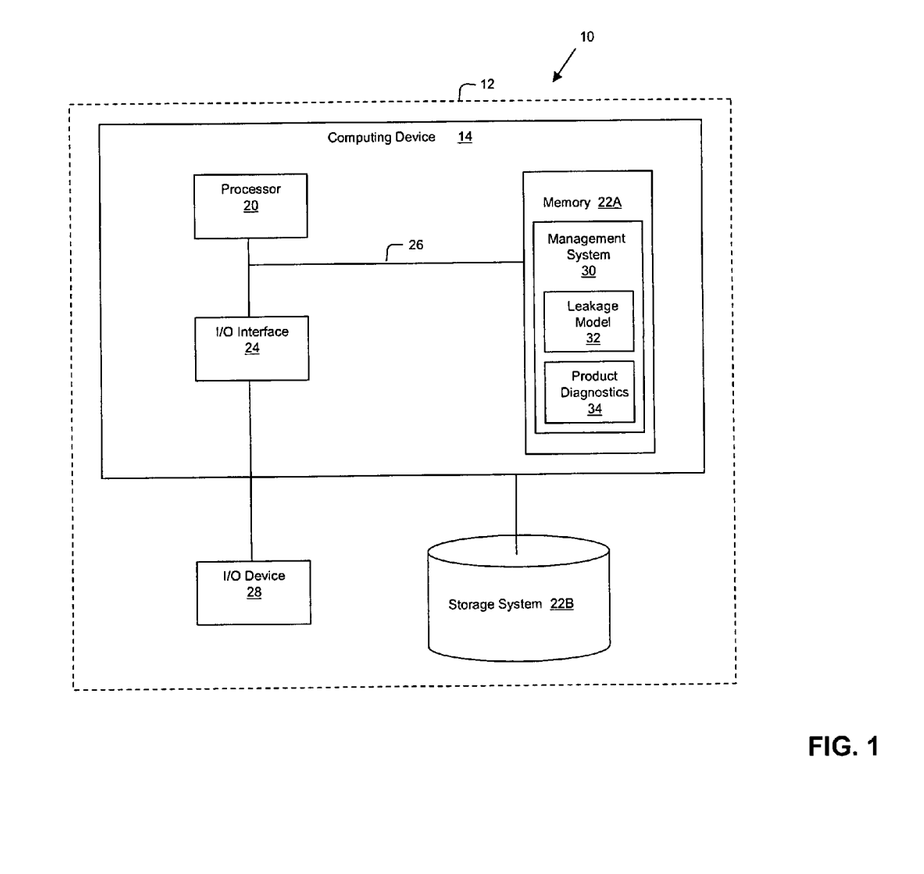
FIG. 1 shows an illustrative environment for implementing the steps in accordance with the invention.

FIG. 1 shows an illustrative environment 10 for managing the processes in accordance with the invention. To this extent, the environment 10 includes a server 12 that can perform the processes described herein. In particular, the server 12 includes a computing device 14 that comprises a management system 30, which includes a leakage model 32 to predict chip leakage and a product diagnostic component 34 structured to analyze chip leakage and provide feedback to manufacturers and/or chip designers.

The computing device 14 includes a processor 20, a memory 22A, an input/output (I/O) interface 24, and a bus 26. The memory 22A can include local memory employed during actual execution of program code, bulk storage, and cache memories which provide temporary storage of at least some program code in order to reduce the number of times code must be retrieved from bulk storage during execution. Further, the computing device 14 is in communication with an external I/O device/resource 28 and a storage system 22B. For example, the I/O device 28 can comprise any device that enables an individual to interact with the computing device 14 or any device that enables the computing device 14 to communicate with one or more other computing devices using any type of communications link. The external I/O device/resource 28 may be keyboards, displays, pointing devices, etc.

In general, the processor 20 executes computer program code, which is stored in memory 22A and/or storage system 22B. While executing computer program code, the processor 20 can read and/or write data to/from memory 22A, storage system 22B, and/or I/O interface 24. The bus 26 provides a communications link between each of the components in the computing device 14.

The computing device 14 can comprise any general purpose computing article of manufacture capable of executing computer program code installed thereon (e.g., a personal computer, server, handheld device, etc.). However, it is understood that the computing device 14 is only representative of various possible equivalent computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the server 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process as described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

In embodiments, the invention provides a business method that performs the steps of the invention on a subscription, advertising, and/or fee basis. That is, a service provider, such as a Solution Integrator, could offer to perform the processes described herein. In this case, the service provider can create, maintain, deploy, support, etc., a computer infrastructure that performs the process steps of the invention for one or more customers. In return, the service provider can receive payment from the customer(s) under a subscription and/or fee agreement and/or the service provider can receive payment from the sale of advertising content to one or more third parties.

IDDQ Prediction Macro

Figure 2:
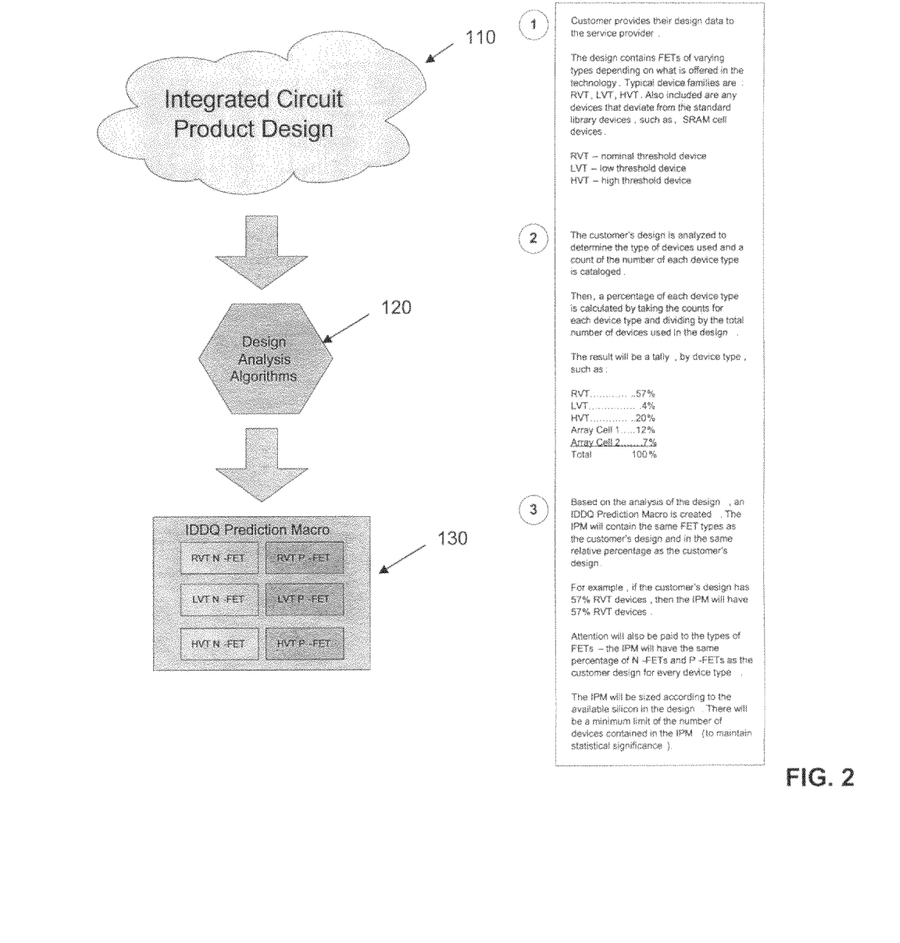
FIG. 2 shows the creation of an IDDQ prediction macro in accordance with the invention.

FIG. 2 illustrates how an IDDQ Prediction macro for predicting a chip's IDDQ may be created according to an embodiment of the present invention. An IDDQ prediction macro like the IDDQ prediction macro 130 described below may be used to, e.g., develop leakage predictions for use in chip power estimates. The first step in creating an IDDQ prediction macro 130 is to obtain the product design 110. This product design 110 is then sent to a design analysis component 120 so that the composition of the design 110 can be determined.

Each product design 110 can be comprised of one or more device types, which affect the amount of leakage that occurs in a product. For example, a product's design 110 may be comprised of a number of field effect transistors (FETs). The types of FETs in the design may vary and include nominal threshold devices (RVT), low threshold devices (LVT), high threshold devices (HVT), etc. Additional devices that deviate from the standard library of devices, such as static random access memory (SRAM), may also be included in the design. Each type of FET may be further classified as NFETs or PFETs.

The design analysis component 120 determines what type of devices are used in a design and the number of times each type of device occurs. This information can be optionally cataloged and a determination can be made as to what percentage of a design is comprised by each type of device. The percentage can be calculated by taking the counts for each device type and dividing by the total number of devices used in the design. Therefore, for example, if a design has 100 FETs with 50 RVTs, 20 LVTs, 20 HVTs, and 10 array cells, then the percentages would be calculated as 50, 20, 20, and 10 respectively.

The information obtained by the design analysis component may be used to create an IDDQ prediction macro 130, which has the same device types as the product design 110 and in the same relative percentage as the product design 110. For example, if 50 percent of the product design 110 is RVTs then 50 percent of the IDDQ prediction macro will be RVTs. While this example is simplistic, it should be understood that percentages may be altered in embodiments to account for computational factors such as rounding.

As one skilled in the art should realize, a certain level of statistical significance is required to ensure an IDDQ prediction macro obtains accurate results while not taking up too much space. Therefore, embodiments may require a minimum limit on the number of devices used to comprise the IDDQ prediction macro. For example, a design having 20 HVTs may be represented in the IDDQ prediction macro by 4 HVTs provided that a 20 percent ratio is maintained and at least a minimum number of devices are used to maintain statistical significance. Once the IDDQ prediction macro is designed, it may be sized according to the available silicon in the design.

Figure 3:
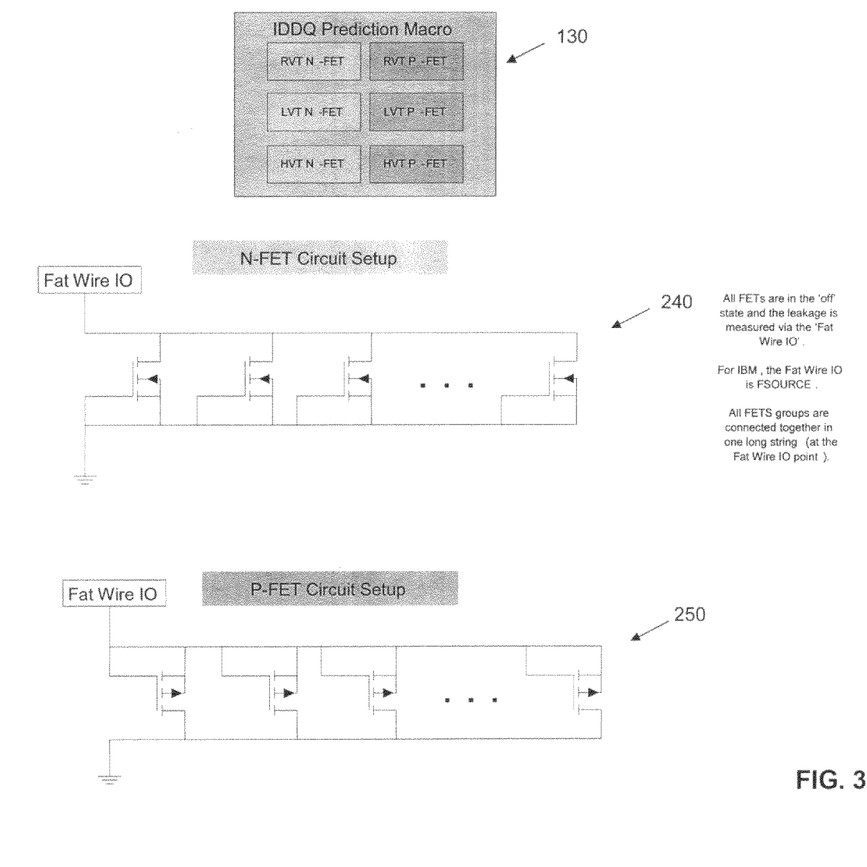
FIG. 3 illustrates an IDDQ prediction macro having field effect transistors (FETs) in accordance with the invention.

FIG. 3 illustrates an IDDQ prediction macro having field effect transistors (FETs) according to an embodiment of the invention. More specifically, FIG. 3 includes the IDDQ prediction macro 130 created in FIG. 2. Within the IDDQ prediction macro 130 are a number of N-FET circuit set-ups 240 and P-FET circuit set-ups 250. The IDDQ prediction macro is configured to measure leakage occurring in the N-FETs and P-FETs while in an off state. This measurement may be obtained using a number of mechanisms such as a fat wire input/output (IO). Embodiments may use any number of fat wire IOs.

The circuit set-ups 240, 250 in FIG. 3 include a number of FETs that are connected in parallel. By connecting the FETs together in this way, the measurement more accurately represents product leakage. This also allows embodiments to connect FETs, i.e., devices, using a multitude of combinations so that different chip topographies and proximity effects can be identified. After the FETs have been connected, and a macro created, leakage can be precisely determined through the application of voltage and measurement of current via the fat wire IO connection. The measured subthreshold leakage and gate leakage values from the IDDQ prediction macros can be represented as a percentage of overall leakage.

While it is possible to have a single FET in the IDDQ prediction macro, one skilled in the art should recognize that isolated devices work differently than interconnected devices. Therefore, nesting devices allows designers to better understand how the devices within a design interact so that leakage for the entire design can be analyzed; instead of analyzing leakage for isolated FETs within a design. This is particularly relevant, for example, if one device within a design has a very high overall leakage in isolation, but results in a considerably low overall leakage when combined with one or more additional devices that are part of the design. In such cases, an analysis of single devices may result in discarding designs which, when combined with other devices in the design, would otherwise result in a relatively low leakage. Accordingly, this IDDQ prediction macro 130 provides for reliable device level leakage measurements that can be used to develop leakage predictions for use in chip power estimates, thereby allowing designers, customers, manufacturers, etc., to obtain a better understanding of leakage within a chip design prior to producing the design.

Creating Leakage Model and Controlling Leakage Using Diagnostics

Figure 4:
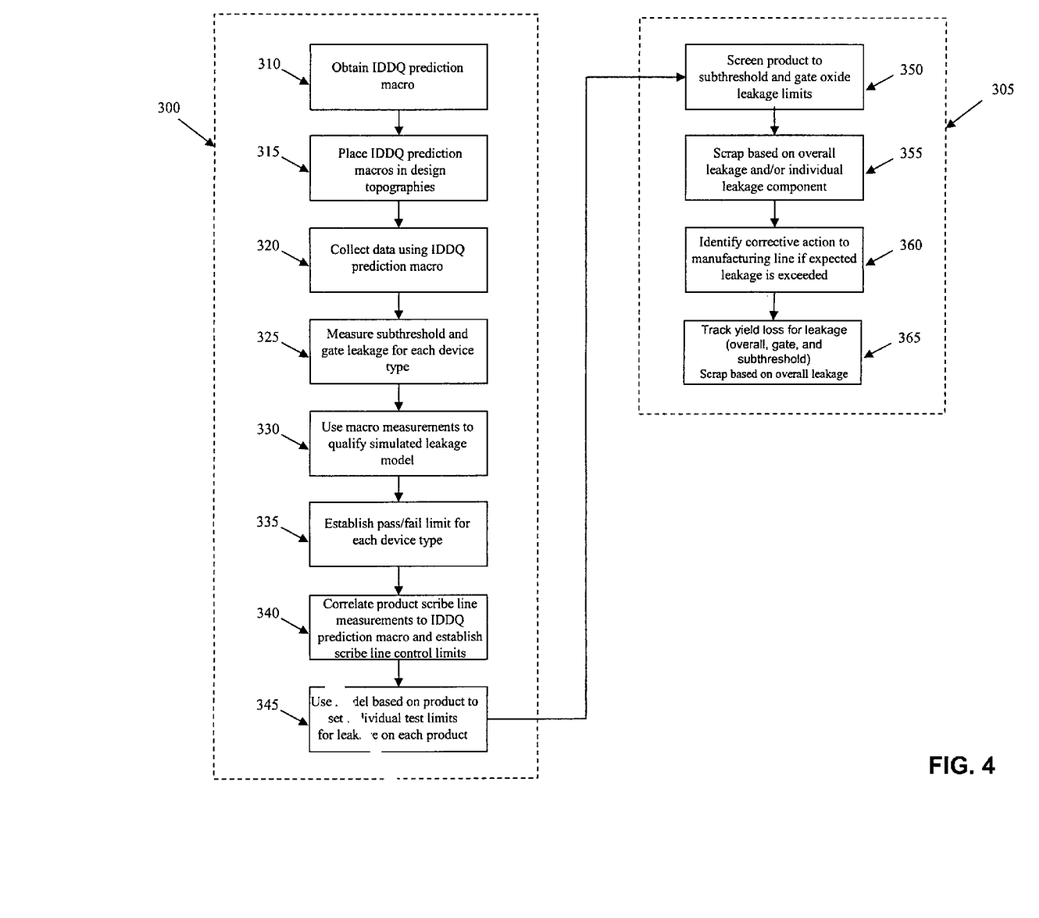
FIG. 4 shows a flow chart for creating a leakage model and applying the model to obtain product yield diagnostics in accordance with the invention.
Figure 5:
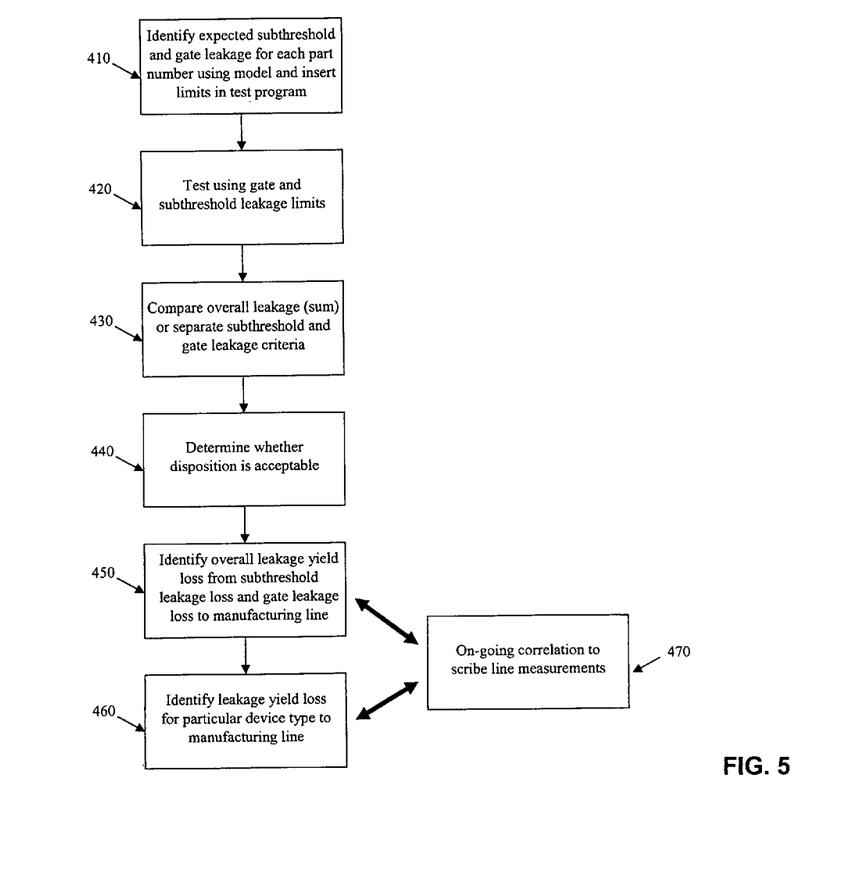
FIG. 5 shows how a manufacturing line can use information on leakage types in accordance with the invention.

FIGS. 4 and 5 are flow diagrams implementing steps of the invention which may be implemented in the environment of FIG. 1. FIGS. 4 and 5 may equally represent a high-level block diagram of the invention. The steps of FIGS. 4 and 5 may be implemented and executed from either a server, in a client server relationship, or they may run on a user workstation with operative information conveyed to the user workstation to determine causes of leakage related to yield loss and provide feedback to manufacturers regarding leakage levels so the causes of the leakage can be ascertained. Additionally, the invention can take the form of an entirely hardware embodiment, an entirely software embodiment or an embodiment containing both hardware and software elements.

In an embodiment, the invention is implemented in software, which includes but is not limited to firmware, resident software, microcode, etc. Furthermore, the invention can take the form of a computer program product accessible from a computer-usable or computer-readable medium providing program code for use by or in connection with a computer or any instruction execution system. The software and/or computer program product can be implemented in the environment of FIG. 1, as should be understood and capable of implementation by those of skill in the art. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) of FIG. 1 can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

More specifically, FIG. 4 illustrates the creation of a leakage model 300 and application of the model to obtain product yield diagnostics 305 in accordance with an embodiment of the present invention. The steps for creating the leakage model 300 can be performed on any integrated circuit that allows device level parametric measurements in a manufacturing test environment to determine key device off currents and accurately model/predict the IDDQ at wafer or module test.

The creation of a leakage model 300 includes obtaining an IDDQ prediction macro at step 310. According to embodiments, the IDDQ prediction macro may be a scalable parametric measurement (SPM) macro, created to measure and/or monitor subthreshold leakage and gate leakage in a semiconductor test site. (The SPM macro is described in commonly owned U.S. application Ser. No. 11/459,367, the disclosure of which is expressly incorporated by reference herein in its entirety.) It may be advantageous for the IDDQ prediction macro to be an on-chip parametric performance monitoring system that can be included on product chips. In this manner, the chip can be tested at wafer final test, at module and/or at system test. A further benefit of the IDDQ prediction macro can be that it may be placed anywhere on the chip, since no additional specific external pinout is necessary. While the SPM macro may be used in embodiments, it should be understood that embodiments may use any number of macros that have an unused input/output slot and are configured to measure subthreshold leakage and gate leakage in a semiconductor test site and in scribe lines.

At step 315, the IDDQ prediction macros may be placed in any number of chip design environments or topographies having different densities, shapes, etc. This includes placing IDDQ prediction macros in different locations in the die on actual products or test chips. Once the IDDQ prediction macros are placed on a chip, e.g., a semiconductor test site, leakage data may be collected at step 320 and used to calculate overall leakage. Measurements may also be made at step 325 to determine the amount of subthreshold leakage and gate leakage that is occurring for each type of device. Based on the obtained IDDQ prediction macro measurements, a leakage model 300 is qualified at step 330.

Once a leakage model 300 is qualified, pass/fail limits for each type of leakage can be created for each type of device at step 335. Scribe line measurements may be correlated to the leakage model 300 in order to establish scribe line control limits at step 340. By creating this correlation, a product's overall leakage, gate leakage, and subthreshold leakage may be tracked. After the correlation has been made, the model that was created based on the product is used to set individual test limits for the product design at step 345. These test limits are configured to represent the amount of each type of leakage that a product design will incur for each device type and may be used during semiconductor fabrication to set limits for scribe line test.

The leakage model 300 may also be used at step 350 to screen products to determine whether a type of leakage within a product design exceeds the expected leakage determined by the model. At step 355, if the leakage is above the expectation for individual leakage components, a particular leakage component, or composite leakage measurement, then the product can be scrapped. The manufacturing line can create corrective action to resolve the source of the manufacturing excursion or a design can be updated so that the leakage sensitivity is removed at step 360. If the manufacturing line is not able to meet the expected leakage limits, or performs better than the limits, then changes may be made to the leakage model to more accurately predict a product's leakage in the future. While screening product designs, additional information may also be tracked at step 360 such as the yield loss for overall leakage, gate leakage, and subthreshold leakage. This information is used by the manufacturing line to identify corrective action to decrease yield loss to the individual leakage components and/or composite leakage at step 365.

FIG. 5 illustrates in more detail how a manufacturing line can use leakage type, e.g., subthreshold leakage, gate leakage according to embodiments of the invention. When controlling leakage, at step 410, the process identifies the expected amount of subthreshold leakage and gate leakage that occurs for each device within a design. The type and amount of leakage can be identified using the leakage model described above. The expected leakage for each device type can be multiplied by the number of that type of device in a product to determine the expected product leakage by device type and leakage type. Once the expected product leakages are identified, upper limits or thresholds are determined. The upper limits are determined by analyzing the amount and type of leakage that occurs within the leakage model and setting a limit based on the upper measurements and/or calculations obtained from the leakage model. These upper limits are then inserted into a product test program.

After an expected subthreshold leakage and gate leakage are determined from the leakage model, the next step is to obtain the actual subthreshold leakage and gate leakage occurring in the product design at step 420. The actual leakage in a design may be determined by placing IDDQ prediction macros in different locations on the product design and testing them using the process as described above. Once the testing is complete, the actual subthreshold leakage, gate leakage, or an overall leakage, can then be compared to the expected leakage at step 430.

A comparison is made at step 440 to determine whether the actual leakage exceeds the expected leakage limits. Based on this determination, feedback on the overall yield loss from subthreshold leakage and gate leakage can be given to manufacturers at step 450. Additionally, a breakdown of the leakage for each type of device, e.g., RVT, LVT, etc. may be fed back to manufacturers at step 460.

Beneficially, the feedback given to manufacturers not only identifies the yield loss, but also allows manufacturers to identify what process changes could improve yield for particular products, e.g., heat cycle problems, based on the obtained information. Since products that do not meet the leakage limits are scrapped, customer exposure is reduced. Once a problem is identified, the process can be improved to eliminate yield loss or a product can be redesigned to make it less sensitive to a type of leakage. Furthermore, since the amount of leakage in the product can be correlated with the scribe line measurements on an on-going basis, scribe line monitoring strategy in the manufacturing line can be modified based on the information obtained through testing every product chip, as represented at step 470.

Accordingly, the present invention assesses different chip topographies and accounts for variations in products, such as scribe-to-chip offsets, by continually correlating scribe lines in a product design and providing feedback. This feedback includes diagnostics on subthreshold leakage, gate leakage, and overall leakage at a design level and also a device level. As should be understood by those skilled in the art, this allows for more accurate and efficient models that are capable of tracking leakage and providing information to manufacturers, designers, etc., so designs can be effectively evaluated prior to mass production.

While the invention has been described in terms of embodiments, those skilled in the art will recognize that the invention can be practiced with modifications and in the spirit and scope of the appended claims.

What is claimed is:

1. A method for creating a leakage model, comprising:
   placing an integrated circuit quiescent current (IDDQ) prediction macro in a plurality of design topographies, the IDDQ prediction macro being a design topography comprising same device types as the plurality of design topographies and in a same relative percentage as the plurality of design topographies;
   collecting data using the IDDQ prediction macro;
   measuring subthreshold leakage and gate leakage for at least one device type in a semiconductor test site and in scribe lines of the IDDQ prediction macro;
   establishing the leakage model;
   correlating the semiconductor test site measurements to the scribe line measurements to establish scribe line control limits;
   predicting product leakage; and
   setting subthreshold leakage limits and gate leakage limits for each product using the leakage model.

2. The method of claim 1, wherein the IDDQ prediction macro is a scalable parametric measurement macro configured to measure the subthreshold leakage and the gate leakage in the semiconductor test site and in the scribe lines.

3. The method of claim 1, wherein the establishing the leakage model is performed using information from the semiconductor test site and the scribe lines, the information comprising the at least one device type and at least one number of times each device type occurs.

4. The method of claim 1, wherein the plurality of design topographies include at least one of different densities and shapes.

5. The method of claim 1, wherein the collecting data is performed using a plurality of IDDQ prediction macros.

6. The method of claim 1, wherein the measuring the subthreshold leakage and the gate leakage for the at least one device type occurs at one or more of the semiconductor test site and the scribe line.

7. The method of claim 1, wherein the scribe line control limits are used during semiconductor fabrication.

8. The method of claim 1, wherein the leakage model is established using information from the semiconductor test site, the information comprising the at least one device type and at least one number of times each device type occurs.

9. The method of claim 1, further comprising:
   at least one of creating a corrective action to resolve a source of a manufacturing excursion in a product and updating a design of the product such that a leakage sensitivity is removed, if one or more of the subthreshold leakage limits and the gate leakage limits are exceeded;
   identifying another corrective action to decrease at least one of subthreshold leakage and gate leakage yield losses and an overall leakage, if an overall leakage limit is exceeded.

10. The method of claim 9, wherein:
    the IDDQ prediction macro comprises at least a minimum number of devices;
    the IDDQ prediction macro is sized according to an available silicon in the plurality of design topographies; and
    the IDDQ prediction macro comprises one or more field effect transistors (FETs) connected in parallel.

11. A method for analyzing product yields, comprising:
    providing a computer infrastructure operable to:
       place an integrated circuit quiescent current (IDDQ) prediction macro in a plurality of design topographies, the IDDQ prediction macro being a design topography comprising same device types as the plurality of design topographies and in a same relative percentage as the plurality of design topographies;
       measure subthreshold leakage and gate leakage for at least one device type in a semiconductor test site and in scribe lines of the IDDQ prediction macro, to establish a leakage model;
       set subthreshold leakage limits and gate leakage limits for a product using the leakage model;
       screen the product to obtain subthreshold leakage and gate leakage yield losses;
       determine whether one or more of the subthreshold leakage and the gate leakage exceed the subthreshold leakage limits and gate leakage limits; and
       provide feedback if one or more of the subthreshold leakage limits and the gate leakage limits are exceeded.

12. The method of claim 11, wherein the providing feedback includes one or more of identifying the location of the leakage and what type of leakage occurred.

13. The method of claim 11, further comprising scraping the product if one or more of the subthreshold leakage limits and the gate leakage limits are exceeded.

14. The method of claim 11, further comprising tracking the subthreshold leakage and gate leakage yield losses and adjusting the leakage model based on the subthreshold leakage and gate leakage yield losses.

15. The method of claim 11, further comprising providing feedback if an overall leakage limit is exceeded.

16. The method of claim 15, wherein the overall leakage is the sum of the subthreshold leakage and the gate leakage.

17. The method of claim 11, wherein the computer infrastructure is further operable to:
    at least one of create a corrective action to resolve a source of a manufacturing excursion in the product and update a design of the product such that a leakage sensitivity is removed, if one or more of the subthreshold leakage limits and the gate leakage limits are exceeded;
    identify another corrective action to decrease at least one of the subthreshold leakage and gate leakage yield losses and an overall leakage, if an overall leakage limit is exceeded.

18. The method of claim 17, wherein:
    the IDDQ prediction macro comprises at least a minimum number of devices;
    the IDDQ prediction macro is sized according to an available silicon in the plurality of design topographies; and
    the IDDQ prediction macro comprises one or more field effect transistors (FETs) connected in parallel.

19. A computer program product comprising a tangible computer usable storage medium having readable program code embodied in the storage medium, the computer program product includes at least one component to:

place an integrated circuit quiescent current (IDDQ) prediction macro in a plurality of design topographies, the IDDQ prediction macro being a design topography comprising same device types as the plurality of design topographies and in a same relative percentage as the plurality of design topographies;

measure subthreshold leakage and gate leakage using the IDDQ prediction macro;

create a leakage model using the measurements collected from the IDDQ prediction macro;

correlate a product's scribe line measurements to the measurements collected from the IDDQ prediction macro;

track yield losses for the subthreshold leakage and the gate leakage of the product; and determine whether the subthreshold leakage and the gate leakage of the product has been exceeded based on the model.

20. The computer program product of claim 19, further comprising a component to provide feedback if the subthreshold leakage and/or the gate leakage exceeds an expected leakage, which is determined at least in part from the measurements collected from the IDDQ prediction macro.

21. The computer program product of claim 20, wherein the feedback includes one or more of identifying the location of the leakage and what type of leakage occurred.

22. The computer program product of claim 19, further comprising a component to adjust the leakage model based on the yield losses.

23. The computer program product of claim 19, wherein the subthreshold leakage and gate leakage are measured at a semiconductor test site and in scribe lines using the IDDQ prediction macro.

24. The computer program product of claim 19, wherein the subthreshold leakage and the gate leakage are measured using a plurality of IDDQ prediction macros.

25. The computer program product of claim 19, wherein the at least one component is further operable to:

at least one of create a corrective action to resolve a source of a manufacturing excursion in the product and update a design of the product such that a leakage sensitivity is removed, if one or more of the subthreshold leakage and the gate leakage exceeds an expected leakage;

identify another corrective action to decrease at least one of the subthreshold leakage and gate leakage yield losses and an overall leakage, if an overall leakage limit is exceeded.

26. The computer program product of claim 25, wherein:

the IDDQ prediction macro comprises at least a minimum number of devices;

the IDDQ prediction macro is sized according to an available silicon in the plurality of design topographies; and the IDDQ prediction macro comprises one or more field effect transistors (FETs) connected in parallel.

* * * * *